United States Patent
Farkas

(10) Patent No.: US 8,046,671 B2
(45) Date of Patent: Oct. 25, 2011

(54) METHOD AND APPARATUS FOR ADAPTING DATA TO A TRANSPORT UNIT OF A PREDEFINED SIZE PRIOR TO TRANSMISSION

(75) Inventor: Peter Farkas, Bratislava (SK)

(73) Assignee: Nokia Siemens Networks GmbH & Co. KG, Munich (DE)

( * ) Notice: Subject to any disclaimer, the term of this patent is extended or adjusted under 35 U.S.C. 154(b) by 427 days.

(21) Appl. No.: 11/988,294

(22) PCT Filed: Jun. 19, 2006

(86) PCT No.: PCT/EP2006/063305
§ 371 (c)(1),
(2), (4) Date: Jun. 24, 2009

(87) PCT Pub. No.: WO2007/003500
PCT Pub. Date: Nov. 1, 2007

(65) Prior Publication Data
US 2010/0005369 A1    Jan. 7, 2010

(30) Foreign Application Priority Data
Jul. 4, 2005  (EP) .................................... 05014465

(51) Int. Cl.
*H03M 13/00* (2006.01)
*G06F 7/02* (2006.01)
(52) U.S. Cl. ........................... 714/821; 714/776
(58) Field of Classification Search ............. 714/48, 714/712, 746, 752, 755, 776, 784, 786, 799, 714/821
See application file for complete search history.

(56) References Cited

U.S. PATENT DOCUMENTS

| 5,526,370 | A  * | 6/1996 | McAuley ....................... 714/800 |
| 6,798,826 | B1 | 9/2004 | Shiu et al. |
| 7,225,381 | B1 * | 5/2007 | Lehman ......................... 714/746 |
| 7,353,448 | B1 * | 4/2008 | Barash .......................... 714/781 |
| 2003/0133497 | A1 | 7/2003 | Kinjo et al. |

FOREIGN PATENT DOCUMENTS

| EP | 0 105 975 | 4/1984 |
| EP | 1 215 833 | 6/2002 |
| GB | 2 379 141 | 2/2003 |

OTHER PUBLICATIONS

P. Farkas, "Comments on Weighted Sum Codes for Error Detection and Their Comparison with Existing Codes," IEEE/ACM Transactions on Networking, vol. 3, No. 2, 1995, 2 pages.

(Continued)

*Primary Examiner* — Shelly A Chase
(74) *Attorney, Agent, or Firm* — Staas & Halsey LLP

(57) ABSTRACT

An apparatus and a method for adapting data in a communications system to be transmitted from a sender to a receiver, to a transport unit of a predefined size involve representing said data as a combination of bits over a finite field, wherein said data comprises of an information part and a control part; adapting said represented data to fit said predefined size of said transport unit, by expressing both said information and control parts with bits, wherein said bits are less in number that said represented combination of bits and a number of removed bits is known to said receiver, said removed bits comprise of bits from both said information and control parts.

12 Claims, 6 Drawing Sheets

OTHER PUBLICATIONS

P. Farkas et al., "Modified Generalized Weighted Sum Codes for Error Control," chapter in the textbook Coding, Communications and Broadcasting, Research Studies Press Ltd., Feb. 2000, 8 pages.

A. J. McAuley, "Weighted Sum Codes for Error Detection and Their Comparison With Existing Codes," IEEE/ACM Transactions on Networking, vol. 2, No. 1, Feb. 1994, 14 pages.

P. Farkas, "Comments on Weighted Sum Codes for Error Detection and Their Comparison with Existing Codes," IEEE/ACM Transactions on Networking, vol. 3, No. 2, 1995, 1 page abstract only.

Office Action for Chinese Application No. 200680024416.0, issued on Jun. 28, 2010.

* cited by examiner

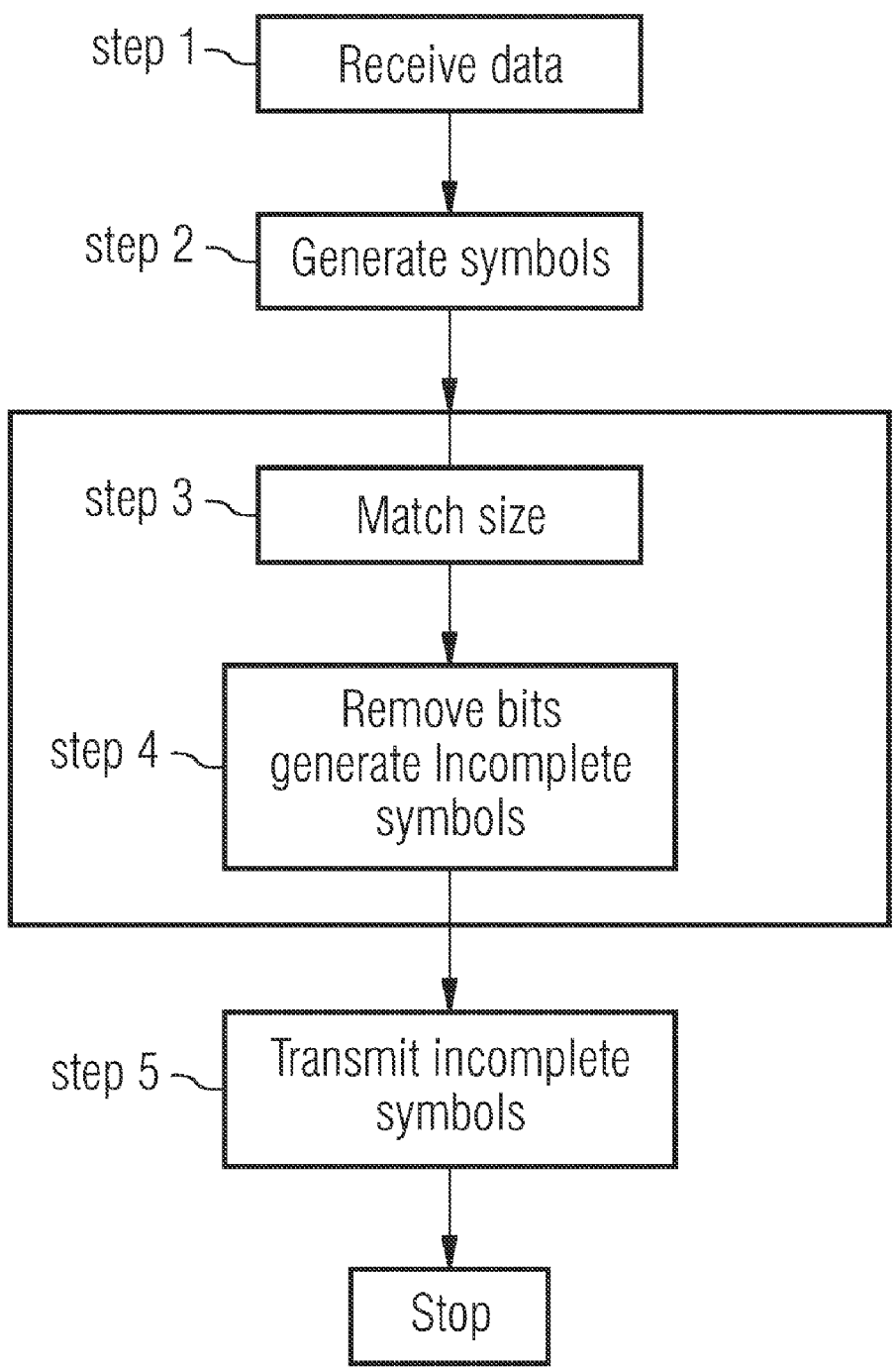

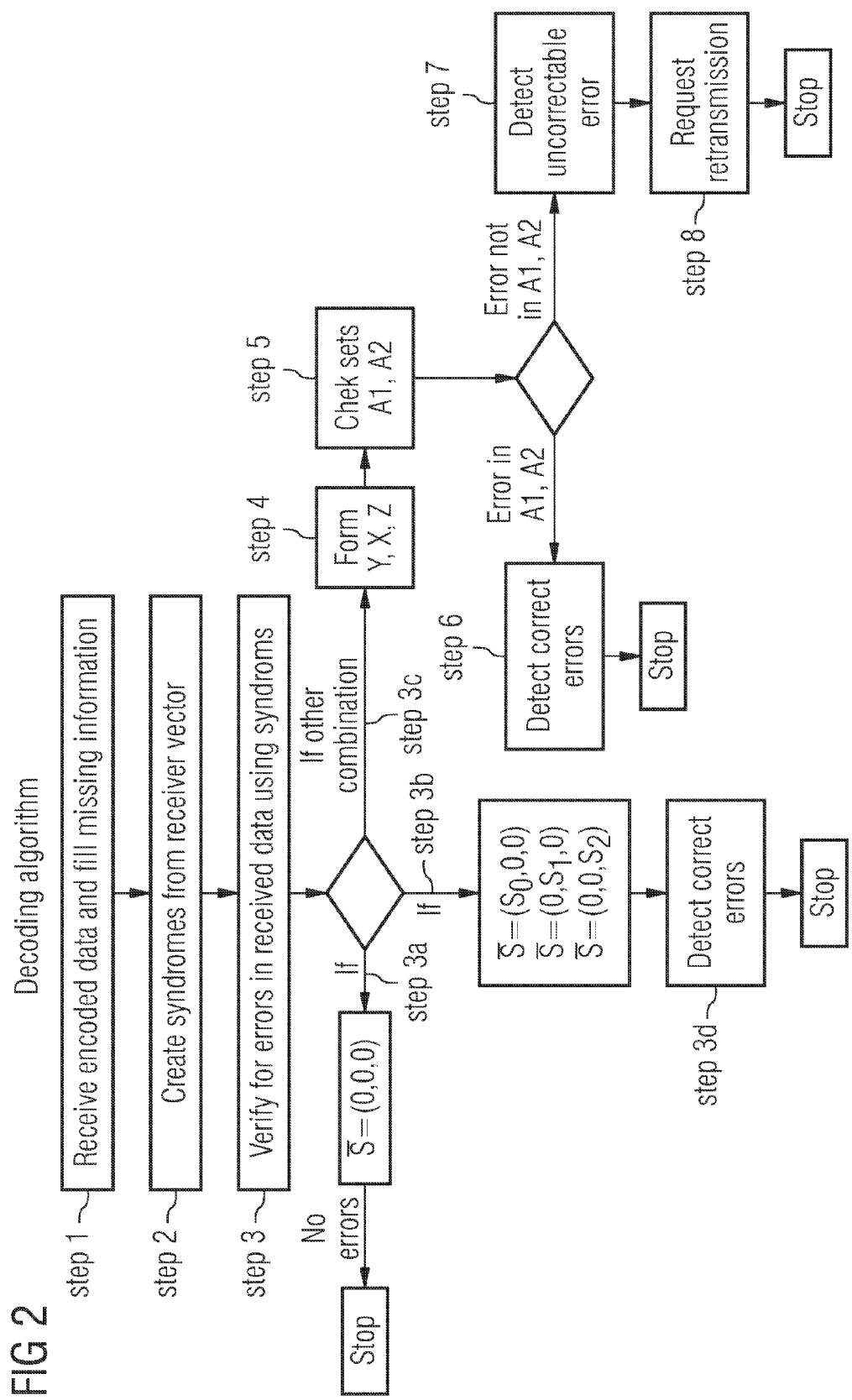

METHOD AND APPARATUS FOR ADAPTING DATA TO A TRANSPORT UNIT OF A PREDEFINED SIZE PRIOR TO TRANSMISSION

CROSS REFERENCE TO RELATED APPLICATIONS

This application is based on and hereby claims priority to PCT Application No. PCT/EP2006/063305, filed on Jun. 19, 2006, and European Application No. 05014465 filed on Jul. 4, 2005, the contents of which are hereby incorporated by reference.

BACKGROUND

Data transmission and data decoding may employ error detection and correction.

The detection and correction of errors that occur to transmitted data is a major issue in communications systems, both for wireless and fixed wire systems. In order to overcome the loss of data or the corruption of data due to errors that occur during the transmission, different types of error detection codes have been introduced that allow for the data to be encoded before transmission and once received for any detected errors to be corrected and the correct data recovered. Such error detection codes are convolutional codes, cyclic codes, block codes to name but a few.

Not all of the different types of these codes have the same error detecting and error correcting capabilities. Some have weaker error detection capabilities than others, which means that a careful choice has to be done before using a particular code.

In A. J. McAuley's "Weighted Sum Codes for Error Detection and their Comparison with Existing Codes", IEEE/ACM Transactions on Networking, vol. 2, No. 1, February 1994, pp 16-22, a new family of error detection codes, Weighted Sum Codes, is described which has very strong error detection capabilities over existing codes.

In P. Farkaš "Comments on Weighted Sum Codes for error detection and their comparison with existing codes", IEEE/ACM Transactions on Networking, vol. 3, no. 2, 1995, pp 222-223 and in P. Farkaš et al., "Modified Generalised Weighted Sum Codes for error control" chapter in the textbook "Coding Communications and Broadcasting", pp. 62-72, Research Studies Press Ltd., England, February 2000, further research and analysis of the advantages of this family of codes in detecting and correcting errors was performed.

Furthermore, problems also occur due to corruption when data is being transmitted over an air-interface, in the case of a wireless communications system, or e.g. in a fibre optic cable, in the case of a terrestrial communications system. The encoded data that is generated by the different error control codes does not easily match the fixed structure of the transporting units, like for example an ATM (Asynchronous Transfer Mode) cell or an IP (Internet Protocol) packet or a frame, and as the generated encoded data has to be shortened, this can cause further difficulties in detecting and correcting the data when errors occur. When errors occur systems have to waste bandwidth resources in retransmitting the erroneous data.

One of the ways that this problem was solved, was by selecting a code whose parameters directly fulfill the predefined constraints of the transport block.

Another approach, was to select a code with a longer codeword (n) and a higher number of information symbols (k) in a codeword and then shortening that code. Shortening is performed by not using a selected number of information symbols.

However both have the drawback that the selected codes do not always have an optimal error detection/correction capability.

SUMMARY OF THE INVENTION

A need therefore exists for a technique to implement a solution that can provide both a detection/correction capability that can detect and correct multiple errors present in the received encoded data, as well as matching the encoded data to a predefined transport unit size prior to transmission.

The method and device proposed by the inventor are responsive both to multiple error detection/correction requirements as well as to matching the encoded data to a predefined transport unit size.

Said method adapts data in a communications system to be transmitted from a sender to a receiver, to a transport unit of a predefined size comprising the steps of:

representing said data as a combination of bits over a finite field, wherein said data comprises of an information part and a control part;

adapting said represented data to fit said predefined size of said transport unit, by expressing both said information and control parts with bits, wherein said bits are less in number that said represented combination of bits and a number of removed bits is known to said receiver, said removed bits comprise of bits from both said information and control parts.

The incomplete symbols that are received include both incomplete control symbols and incomplete information symbols. The transport unit can be a cell, a packet or a frame, and the data can be encoded using an error control code, which can be a Weighted Sum code, a Modified Generalised Weighted Sum code, a Reed Solomon code, a Hamming code, or a Turbo Block code.

BRIEF DESCRIPTION OF THE DRAWINGS

These and other aspects and advantages will become more apparent and more readily appreciated from the following description of the exemplary embodiments, taken in conjunction, with the accompanying drawings of which:

FIG. 1, shows a flow chart displaying the encoding algorithm used in the proposed method.

FIG. 2, shows a flow chart displaying the decoding algorithm used in a decoder.

DETAILED DESCRIPTION OF THE PREFERRED EMBODIMENT

Figure 3A:
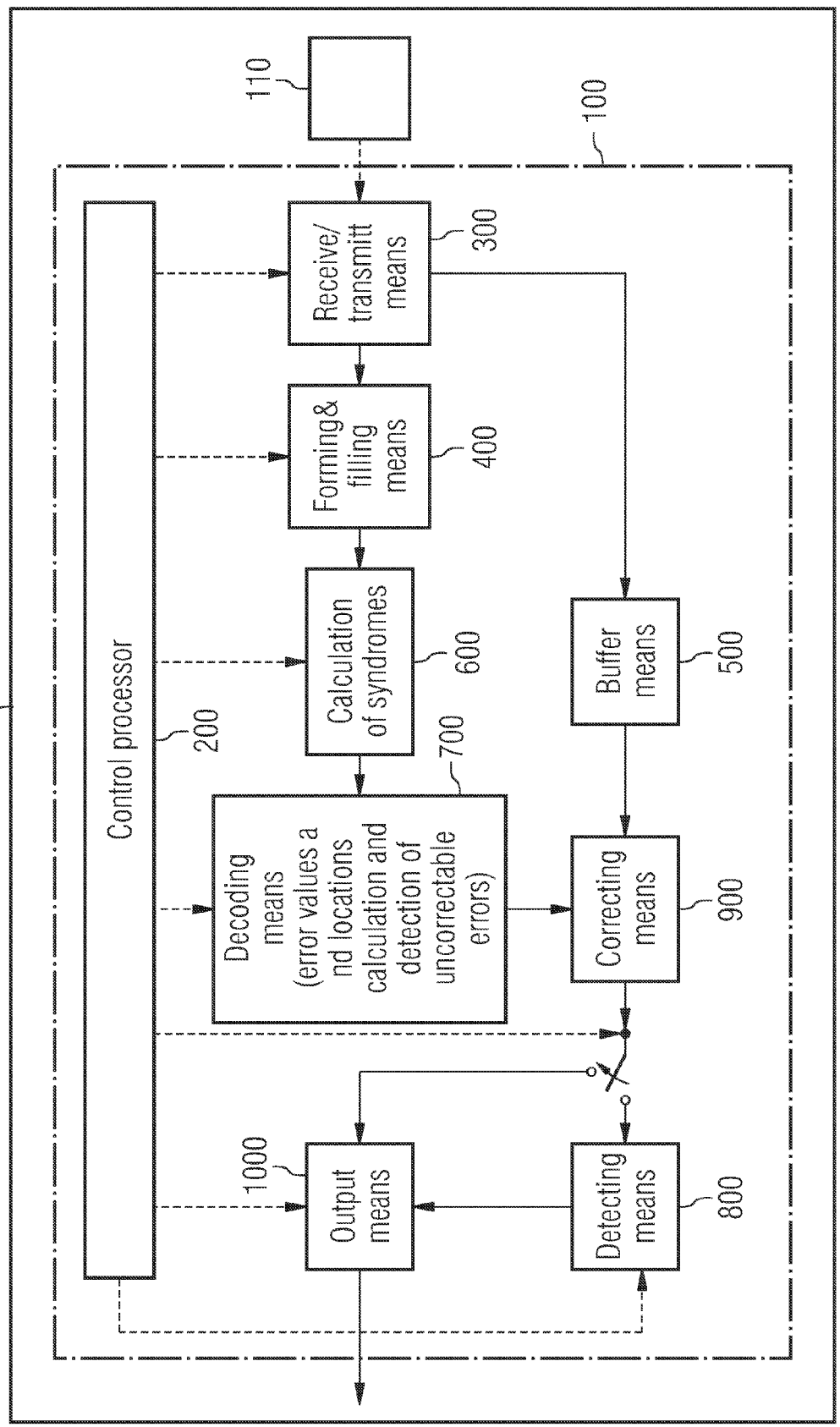
FIGS. 3a, 3b, show an apparatus where the proposed method is implemented.

Reference will now be made in detail to the preferred embodiments, examples of which are illustrated in the accompanying drawings, wherein like reference numerals refer to like elements throughout.

In practical applications of error control codes the parameters of such codes as codeword length, the number of information symbols contained have to be adapted to a predefined transport unit size, as in the case where the transport protocol has a fixed size block for payload and redundancy, as in the case of an ATM cell or IP packet, or frame. Such adaptation can influence the error control capability of the code. Techniques currently in use, only adapt the number of information symbols in order to fit the codeword into the transport unit. Usually, a code with a longer codeword as needed for the given transport unit is chosen with the appropriate error control capability and then the number of information symbols is reduced. The control symbols are not modified. This adaptation, is termed in the literature "shortening". Using it, the amount of information symbols that are to be transmitted is reduced, thus not all information symbols are transmitted. Such adaptations, sometimes, do not allow the use of a code with higher error control capabilities. The terms "symbol/symbols" are equivalent and have the same meaning as the terms "bit/bits" and are used interchangeably.

In order to overcome this, the code parameters are adapted to the available space of the transport unit for the information part (information symbols) and control part (control symbols) of the error control codeword that is to be transmitted. Within the application, the terms "information part" and "information symbol" are equivalent, have the same meaning and are used interchangeably. The same applies for the terms "control part" and "control symbols". Therefore, in the proposed technique not only the information part but also the control part is shortened and in turn also incompletely transmitted, contrary to current use, where only whole information parts are shortened and then transmitted.

In a finite field (also known as a Galois Field or GF(p)) including a set of values plus some defined arithmetic operations such that when these operations are carried out the result yields values only within the defined set. A GF(p) is called the prime field of order p, where p elements are denoted 0, 1, ... $p^{-1}$. The properties of a finite field are:
a) There are two defined operations, addition and multiplication.
b) The result of adding or multiplying two elements from the field is always an element of the field.
c) One element of the field is the element zero, such that $\alpha+0=\alpha$, for any element $\alpha$ in the field.
d) One element of the field is unity, such that $\alpha \times 1=\alpha$, for any element $\alpha$ in the field.
e) For every element $\alpha$ in the field, there is an additive inverse element $-\alpha$, such that $\alpha+(-\alpha)=0$. This allows the operation of subtraction to be defined as addition of the inverse.
f) For every nonzero element $\alpha$ in the field there is a multiplicative inverse element $\alpha^{-1}$, such that $\alpha \times \alpha^{-1}=1$. This allows the operation of division to be defined as a multiplication by the inverse.
g) The associative $[\alpha+(b+c)=(\alpha+b)+c, \alpha \times (b+c)=(\alpha \times b) \times c]$, commutative $[\alpha+b=b+\alpha, \alpha \times b=b \times \alpha]$, and distributative $[\alpha \times (b+c)=\alpha \times b + \alpha \times c]$ laws apply. Where $\alpha$, b, c are elements of the field.

In a GF(16) (Galois Field or Finite Field), for example, each individual piece of data can be expressed as a 4-bit combination. Instead of using all 4 bits when encoding the data, 1, 2, or 3 bits can be used depending on the predefined transport unit size and the application to be encoded. It can be seen that this technique provides a user with a lot more freedom to adapt the process to the requirements at hand and it also improves the overall error control capabilities of the scheme because the original code can be selected from bigger sets of codes with better error control capabilities.

By assigning a fixed value to the parts (number of bits from the information part and control part) that are not used in the transmission, which is agreed upon by a sender and a receiver, the receiver can use known methods for decoding the received data, as it can fill in the missing parts. Thus avoiding any significant modification to the mechanism of a decoder. The agreement can be performed at any moment prior to the commencement of the step of representing the data over a finite field as a combination of bits, for example when the sender and the receiver initiate a call set up procedure.

Furthermore, the number of bits that are not used is distributed between the two parts depending on the type of data service required. For example if the service is voice or multimedia (i.e. voice and image) or data, the number of bits not used can be distributed between the two parts equally, or more to one part than the other, so that a better protection can be achieved and the data then can be more easily recovered. In this way the proposed technique provides added flexibility to the way that encoded data can be fitted into a transport unit.

There follows an exemplary embodiment that further illustrates the proposed technique. In this example an ATM cell is used as the predefined transport unit, however it is obvious to any skilled person in the art that other predefined transport unit such as an IP packet or a frame can be substituted to the same effect. Additionally, a GF(8) is used whereby 3 bits are used to express each piece of data.

The bit correspondence of a GF(8) is shown in the following table:

| | |
|---|---|
| 000 | 0 |
| 001 | $\alpha^0$ |
| 010 | $\alpha^1$ |
| 100 | $\alpha^2$ |
| 011 | $\alpha^3$ |
| 110 | $\alpha^4$ |
| 111 | $\alpha^5$ |
| 101 | $\alpha^6$ |

In a first example, it is required to protect the ATM cell header with increased error correcting capability. The standard solutions in the related art, allow for all single bit errors in the 5 byte cell header to be corrected using one of the cell bytes for error control redundancy, abbreviated as the HEC-byte (Header Error Control—byte). An ATM cell has a predefined size of 53 bytes, comprising a 48 byte payload and a 5 byte cell header.

Within the cell header, there exist 4 bytes for information that translates to 32 bits and 1 byte for redundancy equal to 8 bits.

The error control code used to implement the technique, is defined over a GF(8) and has the following H matrix (1):

$$H = \begin{vmatrix} 1 & 1 & 1 & 1 & 1 & 1 & 1 & 1 & 1 & 1 & 1 & 1 & 1 & 1 & 0 & 0 \\ A^6 & a^5 & a^4 & a^3 & a^2 & a^1 & a^0 & a^6 & a^5 & a^4 & a^3 & a^2 & a^1 & a^0 & 0 & 1 & 0 \\ A^6 & a^6 & a^6 & a^6 & a^6 & a^6 & a^6 & a^5 & a^5 & a^5 & a^5 & a^5 & a^5 & a^5 & 0 & 0 & 1 \end{vmatrix}$$

The above matrix (1) has a special structure, which can be better seen if it is expressed as follows (2):

$$H = \begin{vmatrix} A & A & 1 & 0 & 0 \\ & & 0 & 1 & 0 \\ \overline{\alpha}^{(6)} & \overline{\alpha}^{(5)} & 0 & 0 & 1 \end{vmatrix} \quad (3)$$

where $$A = \begin{vmatrix} 1 & 1 & 1 & 1 & 1 & 1 & 1 \\ A^6 & a^5 & a^4 & a^3 & a^2 & a^1 & a^0 \end{vmatrix}$$

and $$\overline{\alpha}^{(5)} = [a^{(5)} a^{(5)} a^{(5)} a^{(5)} a^{(5)} a^{(5)} a^{(5)}] \quad (4)$$

$$\overline{\alpha}^{(6)} = [a^{(6)} a^{(6)} a^{(6)} a^{(6)} a^{(6)} a^{(6)} a^{(6)}] \quad (5)$$

The code was used in this illustrative example, has an original form of an [17, 14, 3] code over a GF(8). Where 17 denotes the codeword length, 14 denotes the number of information symbols and 3 denotes the code distance. Therefore the codeword can be expressed using a vector (6):

$$\vec{c} = [c_{17}, c_{16}, c_{15}, c_{14}, c_{13}, c_{12}, c_{11}, c_{10}, c_9, c_8, c_7, c_6, c_5, c_4, c_3, c_2, c_1]$$

The encoding of this systematic code can be described using a G matrix for which $GH^T=0$ (7) (where $H^T$ is the transposed matrix of H) as follows:

$$\vec{c} = \vec{i} G \quad (8)$$

where $\vec{i} = (i_1, i_2, i_3, \ldots i_{14})$ is an information vector with 14 coordinates over GF(8), which can contain 42 bits of information.

The resulting codeword therefore contains 51 bits, 42 of which can transport information symbols (the information part) and the other 9 bits are formed by 3 control symbols (the control part). This corresponds to step 2 of the encoding algorithm shown in FIG. 1. This codeword can correct any single bit error and any double bit error which appears in a GF(8) symbol and any triple bit error which appears in one symbol over GF(8).

As stated before, the problem is that the parameters of the code (codeword length and information symbols) are not adapted to the available space of the cell header of an ATM cell, i.e. 32 bits for information and 8 bits for redundancy. Using the proposed technique, values can be assigned to parts of a particular symbol or whole symbols thus reducing its size. This corresponds to steps 3 and 4 of the encoding algorithm shown in FIG. 1. For example, zero values can be assigned to the two lsb (least significant bit) positions of the information symbol $i_1$, $i_{12}$ and zero values to all the bits of $i_{13}$, $i_{14}$ in the information vector $\vec{i}$. During encoding, the complete set of 14 symbols over GF(8) is used, including the predefined positions in the first symbol and all other bit positions are filled with information bits according to the following matrix (9):

$$\vec{i} = \begin{vmatrix} B_1 & b_2 & b_5 & b_8 & b_{11} & b_{14} & b_{17} & b_{20} & b_{23} & b_{26} & b_{29} & b_{32} & 0 & 0 \\ 0 & b_3 & b_6 & b_9 & b_{12} & b_{15} & b_{18} & b_{21} & b_{24} & b_{27} & b_{30} & 0 & 0 & 0 \\ 0 & b_4 & b_7 & b_{10} & b_{13} & b_{16} & b_{19} & b_{22} & b_{25} & b_{28} & b_{31} & 0 & 0 & 0 \end{vmatrix}$$

Because the above matrices define a systematic code only multiplication with the last three columns of G is necessary. Once the multiplication is performed, only the msb (most significant bit) positions of symbols $c_{17}=i_1$ (which contains $b_1$) and $c_6=i_{12}$ (which contains $b_{32}$) are transmitted.

Altogether, it is necessary to have 32 binary positions to transmit $c_{17}, c_{16}, c_{15}, c_{14}, c_{13}, c_{12}, c_{11}, c_{10}, c_9, c_8, c_7, c_6$.

From the remaining 8 binary positions 6 can be filled with symbols $c_2, c_3$ and the last two binary positions with 2 msb of symbol $c_1$. The control symbol $c_1$ can be calculated during encoding by multiplying the information vector with the third row of the H matrix.

On the receiver side, in order to decode the above encoded information, after receiving and filling out the information of the incompletely transmitted symbols, step 1 of the decoding algorithm shown in FIG. 2. It has to be noted here as stated above that the receiver is aware of the bits that were not transmitted, the receive vector $\vec{v}$ will have the form (10):

$$\vec{v} = [v_{17}, v_{16}, v_{15}, v_{14}, v_{13}, v_{12}, v_{11}, v_{10}, v_9, v_8, v_7, v_6, v_5, v_4, v_3, v_2, v_1]$$

It is further shown, that one of the coordinates can be corrected. An error in position i can be expressed as follows:

$$v_i = c_i + Y \quad (11)$$

where Y denotes the error value. Let X denote the error locator within block A. In other words it determines which of the positions from a set corresponding to block A is in error. In our example two such sets exist:

$$A_1 \{v_{10}, v_9, v_8, v_7, v_6, v_5, v_4\} \quad (12)$$

$$A_2 = \{v_{17}, v_{16}, v_{15}, v_{14}, v_{13}, v_{12}, v_{11}\} \quad (13)$$

Therefore, if the value of X is known, the position of the error is known within a block A, but not within which block. If $X=\alpha^3$ the position $v_6$ or $v_{13}$ is in error.

In order to decode and locate which positions are in error, the following syndromes are defined. (This corresponds to step 2, in FIG. 2):

$$S_0 = \sum_{i=0}^{17} v_i = Y \quad (14)$$

$$S_1 = YX \quad (15)$$

$$S_2 = YZ \quad (16)$$

Where Y is called the value of the error, X is called the error locator and Z is called the error block locator.
The syndromes can be calculated by multiplication $$\vec{S} = \vec{v} H^T \quad (17)$$

Where $\vec{S} = (S_0, S_1, S_2)$ and $H^T$ is the transposed matrix H.

After performing the syndrome calculation, in step 3 of FIG. 2, based on equation (17), the decoding process will continue as follows:

If $\vec{S}=(0, 0, 0)$, in step 3a of FIG. 2, then the decoding is finished and it is estimated that no errors occurred during transmission and all the received bits in the corresponding positions of the received vector (10) are a correct estimate of the transmitted information.

If $\vec{S}=(S_0, 0, 0)$, in step 3b of FIG. 2, then an error has occurred in symbol $c_3$ and its value is recalculated through encoding similarly to the encoding process, using received information bits, step 3d of FIG. 2.

If $\vec{S}=(0, S_1, 0)$, in step 3b of FIG. 2, then an error has occurred in symbol $c_2$ and its value is recalculated through encoding similarly to the encoding process, using received information bits, step 3d of FIG. 2.

If $\vec{S}=(0, 0, S_2)$, in step 3b of FIG. 2, then an error has occurred in symbol $c_1$ and its value is recalculated through encoding similarly to the encoding process, using received information bits, step 3d of FIG. 2.

In the case of all other combinations in S, in step 3c of FIG. 2, an error has occurred in other positions and the decoding will proceed as follows by calculating the values of Y, X, Z using the already calculated syndromes, in step 4 of FIG. 2:

$$Y = S_0 \quad (18)$$

$$X = S_1/Y \quad (19)$$

$$Z = S_2/Y \quad (20)$$

At this point, one symbol error in GF(8) can be corrected, as the value of the error is known as it is given by Y, the position within block A is given by X and the information in which one of sets $A_1$ or $A_2$ the error is located, is given by Z, step 6 of FIG. 2.

Specifically if Z belongs to the set $\{\alpha^4, \alpha^5\}$ then the error is in set $A_1$. If Z belongs to the set $\{\alpha^2, \alpha^6\}$ then the error is in set $A_2$. In these two cases, step 6 of FIG. 2, the errors having been detected will be in turn corrected.

In the case that Z does not belong to the set $\{\alpha^4, \alpha^5, \alpha^2, \alpha^6\}$, step 7 of FIG. 2, or the error is located in positions that were not transmitted, then the decoding process has detected an uncorrectable error and a retransmission of the data can be requested, step 8 of FIG. 2.

As it can therefore be seen, the proposed technique of using incomplete symbols, provides for a very strong error correction capability, as all single bit errors as well as many double and triple bit errors can be corrected with the same redundancy of one byte. The term "incomplete symbols" is equivalent and has the same meaning as the term "incomplete bit". Specifically, the double and triple errors can be corrected if they are contained in one GF(8) symbol. In other words these errors, do not damage two distinct symbols from GF(8). In contrast, existing techniques can correct all single bit errors but only detect some additional error combinations.

In a second illustrative example, the same encoding as in the first example is kept, with two small modifications. The first one is that only the first msb is transmitted from the symbol $c_1$. The second one is that the one position that becomes available due to the first modification is filled with the overall parity check bit.

The decoding process is similar to the decoding process in the first example with two alterations.

1. The decision regarding the A block in which the symbol error is located is done using the following decision parameters:

If Z belongs to the set $\{\alpha^4, \alpha^5, \alpha^2, \alpha^6\}$, then the error is located in the set $A_1$.

If Z belongs to the set $\{0, \alpha^0, \alpha^1, \alpha^3\}$, then the error is located in the set $A_2$.

2. After decoding, the overall parity check is done using decoded bits of information bits and parity bits. Using this parity check some uncorrectable errors can be detected as well as correcting the errors detected in the above first example, and appropriate action can be taken by the receiver, like requesting a retransmission of the data.

Furthermore, it can be seen that in a more general adaptation of the parameters found in P. Farkaš et al., "Modified Generalised Weighted Sum Codes for error control" chapter in the textbook "Coding Communications and Broadcasting", pp. 62-72, Research Studies Press Ltd., England, February 2000, other alternatives exist for adapting codes when constructed over a GF(8).

When transmitting only the msb from symbol $c_1$ the length of the code can be adapted from 8 bits to 43 bits. When transmitting the two msb from symbol $c_1$ the codeword length can be adapted from 8 bits to 72 bits and if the complete symbol $c_1$ is transmitted then the codeword length can be adapted from 9 bits to 103 bits. If 4 control (parity) symbols are used in the code over the same GF(8), then the length can be adapted in similar steps up to 650 bits.

Furthermore, the proposed technique can be applied to other types of codes used in error control, like Reed Solomon codes, Hamming codes, convolutional codes, or block codes, as the technique is partially independent of the type of code used. The technique provides a designer with the freedom of choosing the type of code that is best suited for the data that needs to be transmitted and at the same time it provided an increased level of error protection.

FIG. 3a, provides a diagrammatic view of an apparatus that is arranged to execute the proposed method.

An apparatus 100 in a communications system 10, comprises of control processor means 200 adapted to control the functioning of the apparatus, receive/transmit means 300 adapted to receive and transmit data to and from at least one user 110 located in the communications system 10. These means 300 are further adapted to transmit and receive data in transport units of a predefined size like a cell or packet or frame. The means 300 then pass on the received data to a buffer means 500 and to Forming/Filling means 400. These means 400 adapted to insert the bits of the incomplete symbols of the data received. Forming means 400 adapted to form a receive vector over a finite field that has a characteristic of 2. Naturally, the forming means 400 can be arranged to form a receive vector over a finite field that has a different characteristic, for example 3, 4 etc. Calculating means 600 adapted to perform a syndrome calculation based upon a series of defined syndromes and on the formed receive vector. Decoding means 700 are adapted to use the resultant syndromes for calculation and the decoding algorithm (decoding logic) to decode the received data, with the aid of the control processor means 200. The decoding means 700 are adapted to recognise and decode data that has been encoded using a Weighted Sum code, a Modified Generalised Weighted Sum code, a Reed Solomon code, a Hamming code, a Turbo Block code or similar types of error control codes. Detecting means 800 adapted to detect using the resulting decoding, a location of an occurrence of an error in the decoded data. Correcting means 900 adapted upon detection of said error to correct the error. The received data once corrected is outputted via adapted output means 1000. All the means in the apparatus are coupled to the control means 200.

Figure 4:
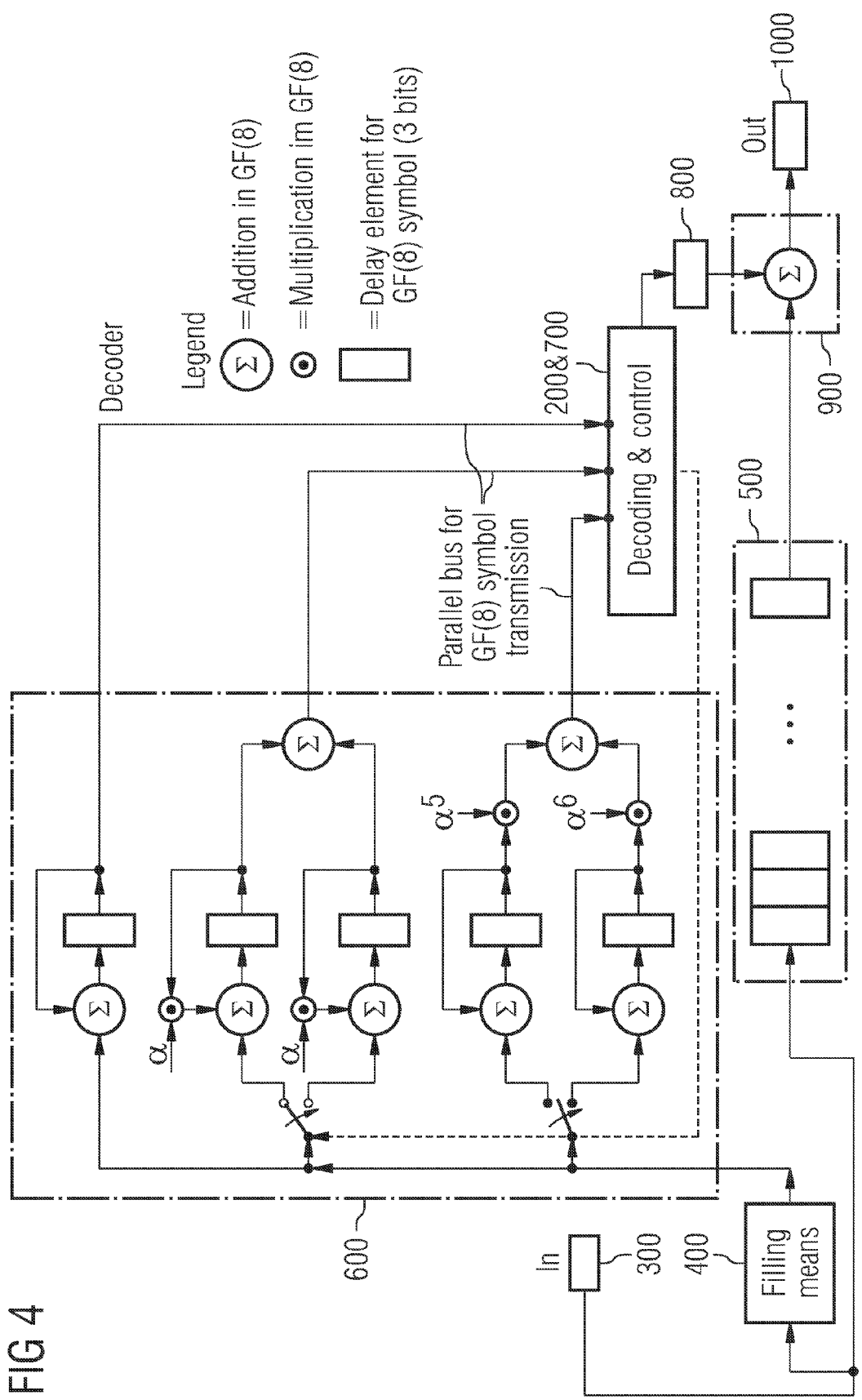
FIGS. 4, 5 show an illustrative implementation of an decoder and symbol generator respectively.

In FIG. 4, an illustrative implementation of the structure of the calculating means 600 is shown. The calculating means 600 comprises of delay elements, for example delay registers which can handle 3 bits of data at a time, adding and multiplication elements that add and multiply the incoming bits, with bits that have been stored during a previous input. The addition and multiplication is performed using the defined operations of the particular set of elements within the finite field, in this instance GF(8), however this can be modified depending on the type of finite field used. It is clear to a person skilled in the art, that upon initialisation of the calculating means 600, there are no bits stored and that the delay elements are empty. The outputs generated are then, under the control of the control processor 200 and the decoding means 700 processed and passed on to the correcting means 900, which also receives the data buffered by the buffer means 500. With the aid of the detecting means 800 which detect the location of any errors the correcting means 900 will generate the correction of the data to be passed on to the output means 1000. Naturally, depending on the type of finite field used, the delay elements are adapted to handle the appropriate number of bits.

The switches are controlled in accordance to the H matrix (sub-matrices A). The first branch from the top corresponds to the first row in the H matrix, therefore there is no switch necessary because there are only 1s in this row. In the second branch which corresponds to the second row in the H matrix from the beginning to the end of the left A sub-matrix, the upper sub-branch will multiply the symbol with $\alpha^0$, it will switch to the lower sub-branch and will stay in this position for the next 7 symbols. The third branch corresponds to the third row in the H matrix, and it functions similarly with the second branch. The same applies for the switches in FIG. 5 which follows.

In the event of no error or errors being detected, the received data is directly outputted by the output means 1000.

In the event that an error has occurred but can not be corrected after detection, the control means 200 will request the user 110 to retransmit that particular part of the data again, by transmitting a request via the receive/transmit means 300.

Figure 3B:
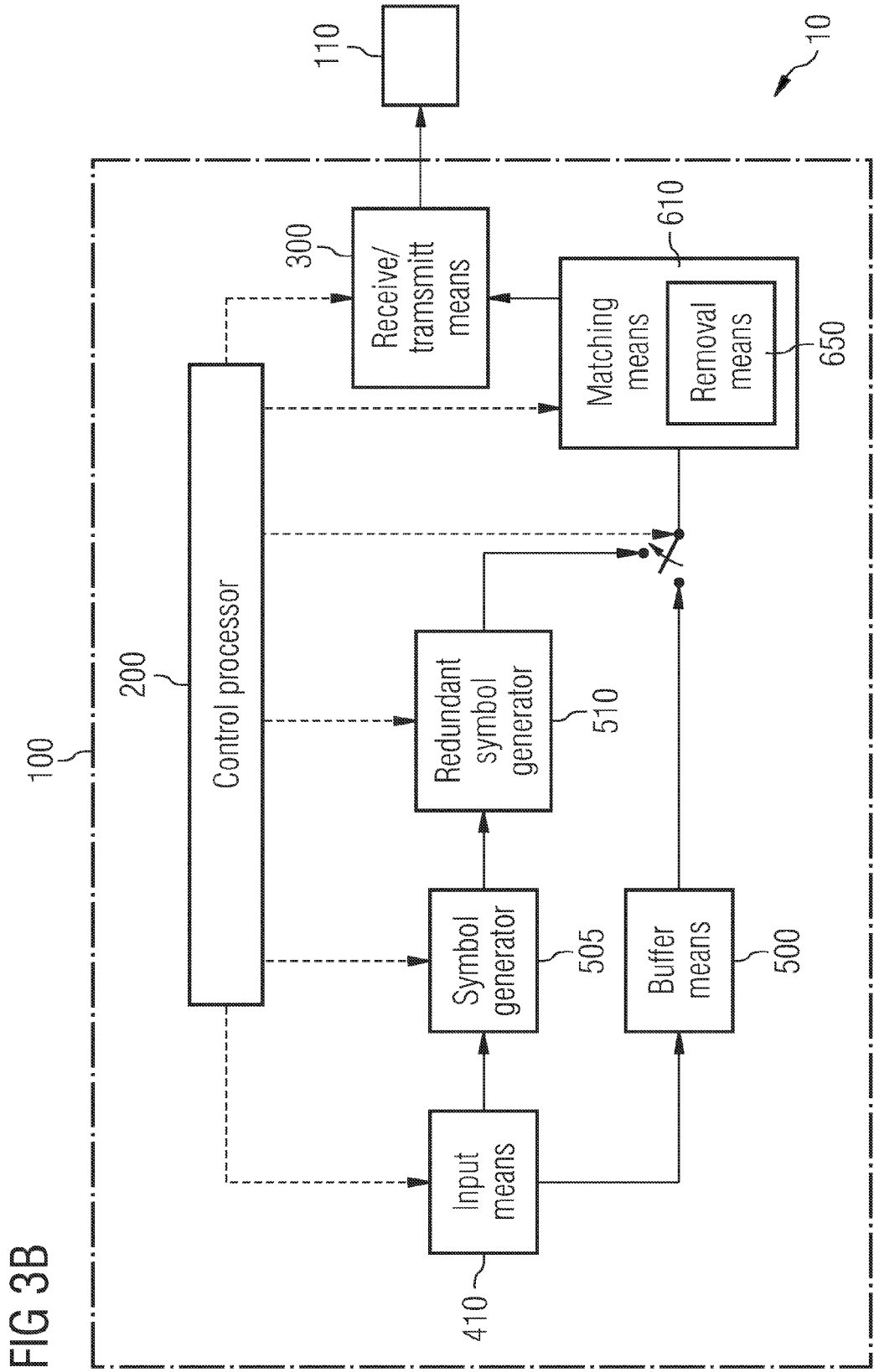

Additionally, the apparatus 100 can be used to encode data that is to be transmitted on the network. FIG. 3b, provides a diagrammatic view of the apparatus, when it is used in this way. The apparatus 100 comprises of control processor means 200 adapted to control the functioning of the apparatus, receive/transmit means 300 adapted to receive and transmit data to and from a user 110 also located in said communications system 10, data input means 410 for receiving data to be encoded, buffer means 500 for buffering a copy of the data to be transmitted, generating means 505 for generating the symbols of the received data, generating means 510 for generating redundant symbols corresponding to the data that is being encoded, matching means 610 and removal means 650 adapted to match the encoded symbols to a predefined size of a transport unit that the control means 200 stipulates, by removing bits from the encoded symbols and generating in turn incomplete symbols that are then transmitted to the user 110 via the receive/transmit means 300.

Figure 5:
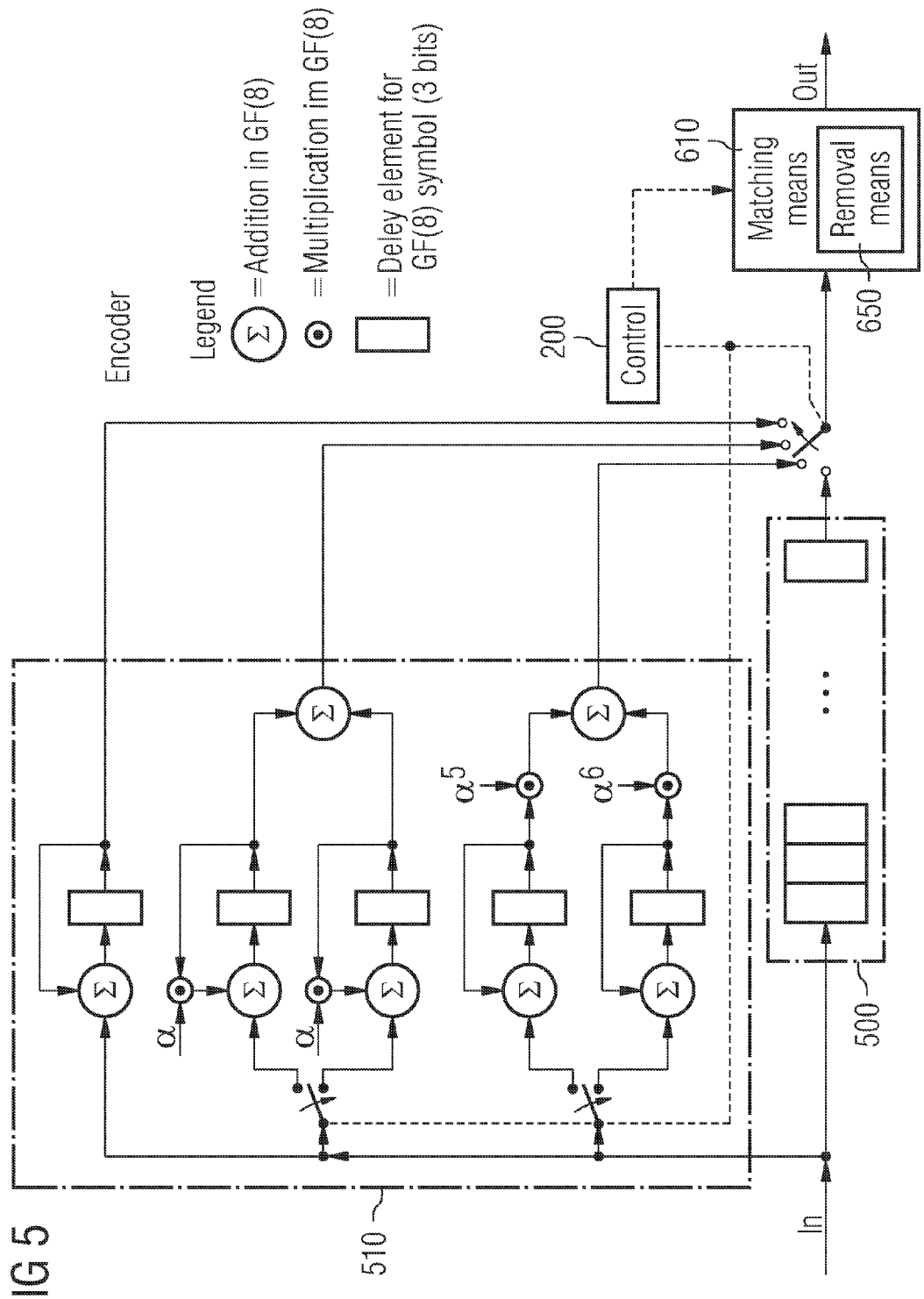

In FIG. 5, an illustrative implementation of the structure of the symbol generator 510 is shown. The symbol generator 510 comprises of delay elements, for example delay registers which can handle 3 bits of data at a time, adding and multiplication elements that add and multiply the incoming bits, with bits that have been stored during a previous input. The addition and multiplication is performed using the defined operations of the particular set of elements within the finite field, in this instance GF(8), however this can be modified depending on the type of finite field used. It is obvious to a person skilled in the art, that upon initialisation of the symbol generator 510, there are no bits stored and that the delay elements are empty. The outputs generated are then, under the control of the control processor 200, transmitted to the matching means 610, as well as the data from the buffer means 500, where the generated data is fitted to the appropriate size of the transportation unit.

Naturally, depending on the type of finite field used, the delay elements are adapted to handle the appropriate number of bits.

The apparatus is arranged to transmit data to a receiver and also to receive data from a sender in a communications system. Such an apparatus can be located in a communications system that is a wireless communication system, a landbase communications system such as a fibre-optic system or a copper-wire system, or a mixture of both. An example of such an apparatus is a base station or a mobile phone located in a mobile communications system.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide* v. *DIRECTV*, 358 F3d 870, 69 USPQ2d 1865 (Fed. Cir. 2004).

The invention claimed is:

1. A method for adapting data having an information part and a control part, the data being adapted for transmission in a communication system from a sender to a receiver, the data being adapted to a transport unit having a predefined size, comprising:
representing the data as a combination of bits over a finite field to thereby form represented data;
adapting the represented data to fit the predefined size of the transport unit and thereby form adapted data, the represented data being adapted by removing bits and expressing both the information part and the control part with bits,
wherein the bits of the adapted data are less in number than the combination of bits of the represented data,
a number of removed bits is known to the receiver, and
the removed bits include both bits removed from the information part and bits removed from the control part.

2. The method according to claim 1, wherein
the removed bits are assigned a fixed value, and
the fixed value is agreed upon between the sender and the receiver prior to representing the data.

3. The method according to claim 2, wherein the number of removed bits is distributed between the information part and the control part based on a type of data service required.

4. The method according to claim 3, wherein the transport unit is at least one of a cell, a packet, and a frame.

5. The method according to claim 4, wherein the sender generates the data using an error control code.

6. The method according to claim 5, wherein the error control code is at least one of a Weighted Sum code, a Modified Generalized Weighted Sum code, a Reed Solomon code, a Hamming code, and a Turbo Block code.

7. The method according to claim 1, wherein the number of removed bits is distributed between the information part and the control part based on a type of data service required.

8. The method according to claim 1, wherein the transport unit is at least one of a cell, a packet, and a frame.

9. The method according to claim 1, wherein the sender generates the data using an error control code.

10. The method according to claim 9, wherein the error control code is at least one of a Weighted Sum code, a Modified Generalized Weighted Sum code, a Reed Solomon code, a Hamming code, and a Turbo Block code.

11. An apparatus in a communications system to adapt data having an information part and a control part, the data being adapted to a transport unit having a predefined size, comprising:
a representation unit to represent the data as a combination of bits over a finite field to thereby form represented data;
an adaption unit to adapt the represented data to fit the predefined size of the transport unit and thereby form adapted data, the represented data being adapted by removing bits and expressing both the information part and the control part with bits; and
a transmitter to transmit the transport unit to another user,
wherein the bits of the adapted data are less in number than the combination of bits of the represented data,
a number of removed bits is known to the receiver, and
the removed bits include both bits removed from the information part and bits removed from the control part.

12. The apparatus according to claim 11 further comprising:
a receiver to receive transport units from the other user; and
a decoder to decode data contained in the transport units received from the other user.

* * * * *